(12) United States Patent
Hosoya et al.

(10) Patent No.: US 7,804,648 B2
(45) Date of Patent: Sep. 28, 2010

(54) MULTILAYER REFLECTIVE FILM COATED SUBSTRATE, MANUFACTURING METHOD THEREOF, REFLECTIVE MASK BLANK, AND REFLECTIVE MASK

(75) Inventors: Morio Hosoya, Tokyo (JP); Takeyuki Yamada, Yamanashi (JP); Akira Ikeda, Chiba (JP)

(73) Assignee: Hoya Corporation, Tokyo (JP)

( * ) Notice: Subject to any disclaimer, the term of this patent is extended or adjusted under 35 U.S.C. 154(b) by 281 days.

(21) Appl. No.: 11/580,934

(22) Filed: Oct. 16, 2006

(65) Prior Publication Data
US 2007/0091420 A1 Apr. 26, 2007

(30) Foreign Application Priority Data
Oct. 14, 2005 (JP) .............................. 2005-300556

(51) Int. Cl.
*G02B 1/10* (2006.01)
(52) U.S. Cl. .................. 359/586; 359/584; 359/589; 359/590
(58) Field of Classification Search .............. 359/359, 359/577, 580, 584, 589, 590, 586
See application file for complete search history.

(56) References Cited
U.S. PATENT DOCUMENTS
5,485,497 A * 1/1996 Oizumi et al. .............. 378/84

| | | | |
|---|---|---|---|
| 7,511,888 B2 * | 3/2009 | Sekine | 359/584 |
| 2004/0231980 A1 | 11/2004 | Takahashi | |
| 2005/0157384 A1 * | 7/2005 | Shiraishi et al. | 359/359 |
| 2005/0213198 A1 * | 9/2005 | Lee et al. | 359/359 |

FOREIGN PATENT DOCUMENTS

| | | |
|---|---|---|
| JP | 8-213303 A | 8/1996 |
| JP | 2003-515794 A | 5/2003 |
| JP | 2004339547 A | 12/2004 |

OTHER PUBLICATIONS

Japanese Office Action corresponding to Japanese Patent Application No. 2005-300575, dated Apr. 28, 2010.

\* cited by examiner

*Primary Examiner*—Joshua L Pritchett
(74) *Attorney, Agent, or Firm*—Sughrue Mion, PLLC

(57) ABSTRACT

A multilayer reflective film coated substrate includes a multilayer under film comprised of Mo/Si alternately-layered films and a multilayer reflective film comprised of Mo/Si alternately-layered films for reflecting exposure light. The multilayer under film and the multilayer reflective film are formed on a substrate in this order. Given that a cycle length of the multilayer under film is d bottom (unit:nm) and a cycle length of the multilayer reflective film is d top (unit:nm), a relationship of a formula (1) is satisfied when d bottom>d top, the formula (1) given by $$(n+0.15) \times d\ \text{top} \leq d\ \text{bottom} \leq (n+0.9) \times d\ \text{top}$$

where n is a natural number equal to or greater than 1.

14 Claims, 5 Drawing Sheets

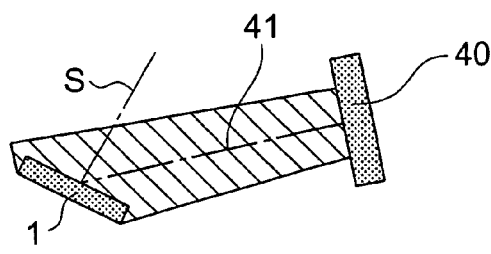
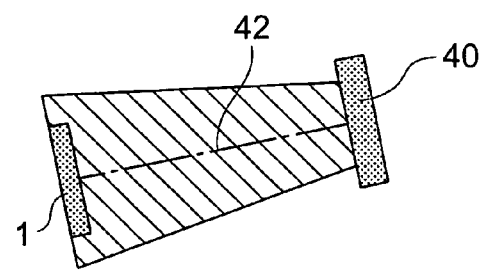
FIG. 1A  FIG. 1B
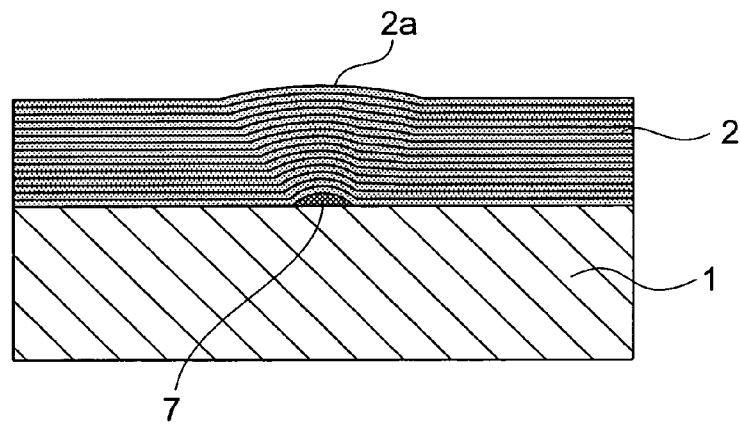
FIG. 2A
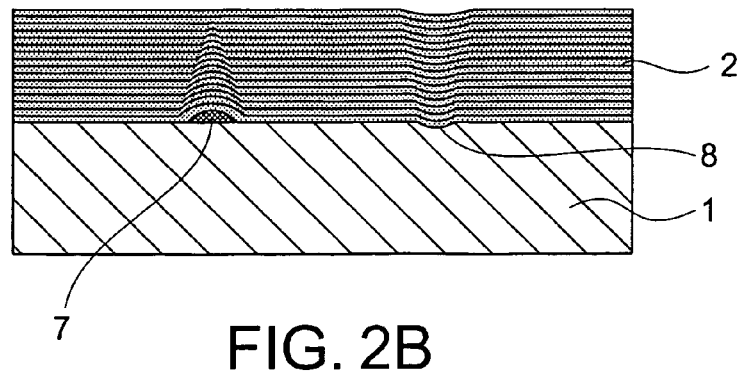
FIG. 2B

MULTILAYER REFLECTIVE FILM COATED SUBSTRATE, MANUFACTURING METHOD THEREOF, REFLECTIVE MASK BLANK, AND REFLECTIVE MASK

This application claims priority to prior Japanese patent application JP2005-300556, the disclosure of which is incorporated herein by reference.

BACKGROUND OF THE INVENTION

This invention relates to a multilayer reflective film coated substrate, a manufacturing method thereof, a reflective mask blank, and a reflective mask. More specifically, this invention relates to a multilayer reflective film coated substrate having high surface smoothness with less defects which is suitable for a reflective mask for use in a lithography method using exposure light in a short wavelength region such as extreme ultraviolet light, and further relates to a method of efficiently manufacturing such a multilayer reflective film coated substrate, a reflective mask blank obtained using such a multilayer reflective film coated substrate, and a high-quality reflective mask obtained using such a reflective mask blank, which is less defective and excellent in pattern transferability.

In recent years, following higher integration of semiconductor devices, patterns finer than the transfer limit of a photolithography method using the conventional ultraviolet light have been required in the semiconductor industry. In order to enable transfer of such fine patterns, the extreme ultraviolet (EUV) lithography being an exposure technique using EUV light with a shorter wavelength has been expected to be promising. The EUV light represents light in a wavelength band of the soft X-ray region or the vacuum ultraviolet ray region and, specifically, light having a wavelength of approximately 0.2 to 100 nm. As an exposure mask for use in the EUV lithography, a reflective mask as described in Japanese Unexamined Patent Application Publication (JP-A) No. H08-213303 has been proposed.

Such a reflective mask has a structure in which a multilayer reflective film for reflecting the EUV light serving as exposure light is formed on a substrate and, further, an absorber film for absorbing the EUV light is formed in a pattern on the multilayer reflective film. When pattern transfer is carried out using an exposure apparatus (pattern transfer apparatus) with the reflective mask disposed therein, the exposure light incident on the reflective mask is absorbed at a portion where the absorber film pattern is present, while, is reflected by the multilayer reflective film at a portion where the absorber film pattern is not present so that the reflected light is transferred onto, for example, a semiconductor substrate (resist-coated silicon wafer) through a reflective optical system.

As the foregoing multilayer reflective film, use is normally made of a multilayer film in which a material having a relatively high refractive index and a material having a relatively low refractive index are alternately layered in the order of several nm. For example, a multilayer film having Si and Mo thin films alternately layered is known as having a high reflectance with respect to EUV light of 13 to 14 nm.

The multilayer reflective film can be formed on the substrate, for example, by ion beam sputtering. In the case of containing Si and Mo, a Si target and a Mo target are used to alternately carry out sputtering so as to laminate Si and Mo films by approximately 30 to 60 cycles, preferably by approximately 40 cycles.

In order to further increase the reflectance with respect to the EUV light, it is necessary to reduce the surface roughness of the multilayer reflective film, while, the surface roughness of the multilayer reflective film largely depends on the surface roughness of the substrate. When, for example, the formation of the multilayer reflective film is carried out by inclining the substrate (i.e. oblique incidence film formation) for equalizing in-plane film thickness distribution of the Si and Mo thin films, this results in an increased surface roughness greater than the surface roughness of the substrate.

Therefore, the requirement for the surface roughness of the substrate is strict and, for example, it is reported that a root-mean-square (Rms) roughness of 0.10 nm or less is desirable.

A glass substrate is normally used as the foregoing substrate. However, even if a glass polishing method of the current state is applied, it is actually quite difficult to obtain a highly smooth and defectless surface that can satisfy the foregoing surface roughness requirement in the case of a glass having a multicomponent amorphous structure.

Generally, a multilayer reflective film is formed on a substrate according to an oblique incidence film formation method. Specifically, as shown in FIG. 1A, in the oblique incidence film formation method, film formation is carried out by disposing a target 40 and a substrate 1 so that sputtered particles from the target 40 are incident on the substrate 1 (the sputtered particles are scattered toward the substrate 1 as a particle group having an increasing width as indicated by hatching) from an oblique direction 41 with respect to a perpendicular direction S. The reason for using such an oblique incidence film formation method is that highly uniform in-plane film thickness distribution of the multilayer reflective film formed can be easily obtained. In contrast, as shown in FIG. 1B, there is a method of forming a multilayer reflective film by a normal incidence film formation method in which film formation is carried out by disposing a target 40 and a substrate 1 so that sputtered particles from the target 40 are incident on the substrate 1 (the sputtered particles are scattered toward the substrate 1 as a particle group having an increasing width as indicated by hatching) from a substantially perpendicular direction 42.

According to the study of the present inventors, when the multilayer reflective film is formed by the oblique incidence film formation method, there is the effect that the uniform in-plane film thickness distribution of the formed multilayer reflective film can be easily obtained as described above, while, there is an adverse effect of making larger a convex projection defect (hereinafter referred to as a "convex defect") present on the surface of the substrate 1. Thus, as shown in FIG. 2A, even if a convex defect 7 on the substrate 1 is too small to be detected by a defect inspection apparatus, it may become a convex defect 2a, which is large enough to be a transfer pattern defect, on the surface of a multilayer reflective film 2 formed by the oblique incidence film formation method.

On the other hand, Japanese Unexamined Patent Application Publication (JP-A) No. 2003-515794 (Japanese translation of PCT international application) discloses to provide a multilayer buffer layer on a reticle substrate in order to reduce an adverse affect of a defect on the reticle substrate. The multilayer buffer layer is formed by the normal incidence film formation method. When the multilayer buffer layer is formed by the normal incidence film formation method, even if a convex defect present on the surface of the reticle substrate can be reduced in size to some extent, a concave defect present on the surface of the reticle substrate may increase in size. Therefore, it is not possible to correct both concave and convex defects solely by this film forming method. This is equivalently shown in FIG. 2B in which numeral 7 denotes a convex defect present on the surface of a substrate 1 while numeral 8 denotes a concave defect present on the surface of the substrate 1. Further, even if the convex defect 7 present on the surface of the substrate 1 is caused to disappear on the surface of a multilayer reflective film 2, since the reflection is the sum of reflections from respective layers of the multilayer reflective film 2, it is easily expected that a phase defect still occurs.

SUMMARY OF THE INVENTION

Under these circumstances, it is an object of this invention to provide a multilayer reflective film coated substrate having high surface smoothness with less defects which is suitable for a reflective mask for use in a lithography method using exposure light in a short wavelength region such as EUV light, and further provide a method of efficiently manufacturing such a multilayer reflective film coated substrate, a reflective mask blank obtained using such a multilayer reflective film coated substrate, and a high-quality reflective mask obtained using such a reflective mask blank, which is less defective and excellent in pattern transferability.

As a result of repeating assiduous studies for accomplishing the above object, the present inventors have found that, in a multilayer reflective film coated substrate comprising a multilayer under film comprised of Mo/Si alternately-layered films and a multilayer reflective film comprised of Mo/Si alternately-layered films for reflecting exposure light, which are formed on a substrate in this order, when a cycle length of the multilayer under film and a cycle length of the multilayer reflective film satisfy a specific relationship therebetween, the multilayer reflective film coated substrate having high surface smoothness with less defects is obtained and, further, the multilayer under film exerts substantially no optical influence.

The present inventors have further found that the multilayer reflective film coated substrate can be suitably manufactured by combining the normal incidence film formation method and the oblique incidence film formation method upon forming the multilayer under film and the multilayer reflective film on the substrate.

Further, the present inventors have found that a reflective mask blank is obtained by forming an absorber film for absorbing the exposure light on the multilayer reflective film in the multilayer reflective film coated substrate and that a high-quality reflective mask having less defects and excellent in pattern transferability is obtained by forming the absorber film with an absorber film pattern that serves as a transfer pattern.

This invention has been completed on the basis of such knowledge.

This invention has the following aspects.

(First Aspect)

A multilayer reflective film coated substrate, comprising:
a multilayer under film comprised of Mo/Si alternately-layered films, and
a multilayer reflective film comprised of Mo/Si alternately-layered films for reflecting exposure light, the multilayer under film and the multilayer reflective film being formed on a substrate in this order,
wherein, given that a cycle length of the multilayer under film is d bottom (unit:nm) and a cycle length of the multilayer reflective film is d top (unit:nm), a relationship of a formula (1) is satisfied when d bottom>d top, the formula (1) given by $$(n+0.15) \times d\ \text{top} \leq d\ \text{bottom} \leq (n+0.9) \times d\ \text{top}$$

where n is a natural number equal to or greater than 1.

(Second Aspect)

A multilayer reflective film coated substrate, comprising:
a multilayer under film comprised of Mo/Si alternately-layered films, and
a multilayer reflective film comprised of Mo/Si alternately-layered films for reflecting exposure light, the multilayer under film and the multilayer reflective film being formed on a substrate in this order,
wherein, given that a cycle length of the multilayer under film is d bottom (unit:nm) and a cycle length of the multilayer reflective film is d top (unit:nm), a relationship of a formula (2) is satisfied when d bottom<d top, the formula (2) given by $$d\ \text{bottom} \leq 0.6 \times d\ \text{top}.$$

(Third Aspect)

A multilayer reflective film coated substrate according to the first or second aspect, wherein:
The d top is 6.5 to 7.5 nm and ΓMo (apparent Mo layer thickness/cycle length) is 0.25 to 0.70 in the multilayer reflective film.

(Forth Aspect)

A multilayer reflective film coated substrate according to the first or second aspect, wherein:
an intermediate layer in the form of a silicon film is interposed between the multilayer under film and the multilayer reflective film.

(Fifth Aspect)

A method of manufacturing the multilayer reflective film coated substrate according to the first or second aspect,
the method comprising the step of forming the multilayer under film comprised of the Mo/Si alternately-layered films and the multilayer reflective film comprised of the Mo/Si alternately-layered films for reflecting the exposure light, on the substrate in this order,
wherein the method combines a normal incidence film formation method that causes sputtered particles from a target to be incident on the substrate from a substantially perpendicular direction and an oblique incidence film formation method that causes sputtered particles from the target to be incident on the substrate from an oblique direction with respect to a perpendicular direction.

(Sixth Aspect)

A method according to the fifth aspect, wherein:
the multilayer under film and the multilayer reflective film are formed by an ion beam sputtering method.

(Seventh Aspect)

A reflective mask blank obtained by forming an absorber film for absorbing the exposure light, on the multilayer reflective film in the multilayer reflective film coated substrate according to the first and second aspect.

(Eighth Aspect)

A reflective mask obtained by forming the absorber film in the reflective mask blank according to the seventh aspect with an absorber film pattern that serves as a transfer pattern.

According to this invention, it is possible to provide a multilayer reflective film coated substrate having high surface smoothness with less defects which is suitable for a reflective mask for use in the lithography method using exposure light in a short wavelength region such as EUV light, and further provide a method of efficiently manufacturing such a multilayer reflective film coated substrate, a reflective mask blank obtained using such a multilayer reflective film coated substrate, and a high-quality reflective mask obtained using such a reflective mask blank, which is less defective and excellent in pattern transferability.

BRIEF DESCRIPTION OF THE DRAWINGS

FIG. 1A is an exemplary diagram showing the layout of a target and a substrate in an oblique incidence film formation method;

FIG. 1B is an exemplary diagram showing the layout of a target and a substrate in a normal incidence film formation method;

FIG. 2A is an exemplary sectional view for explaining a problem in the case where a multilayer reflective film is formed on a substrate by the oblique incidence film formation method;

FIG. 2B is an exemplary sectional view for explaining a problem in the case where a multilayer reflective film is formed on a substrate by the normal incidence film formation method;

DESCRIPTION OF THE PREFERRED EMBODIMENT

Figure 3:
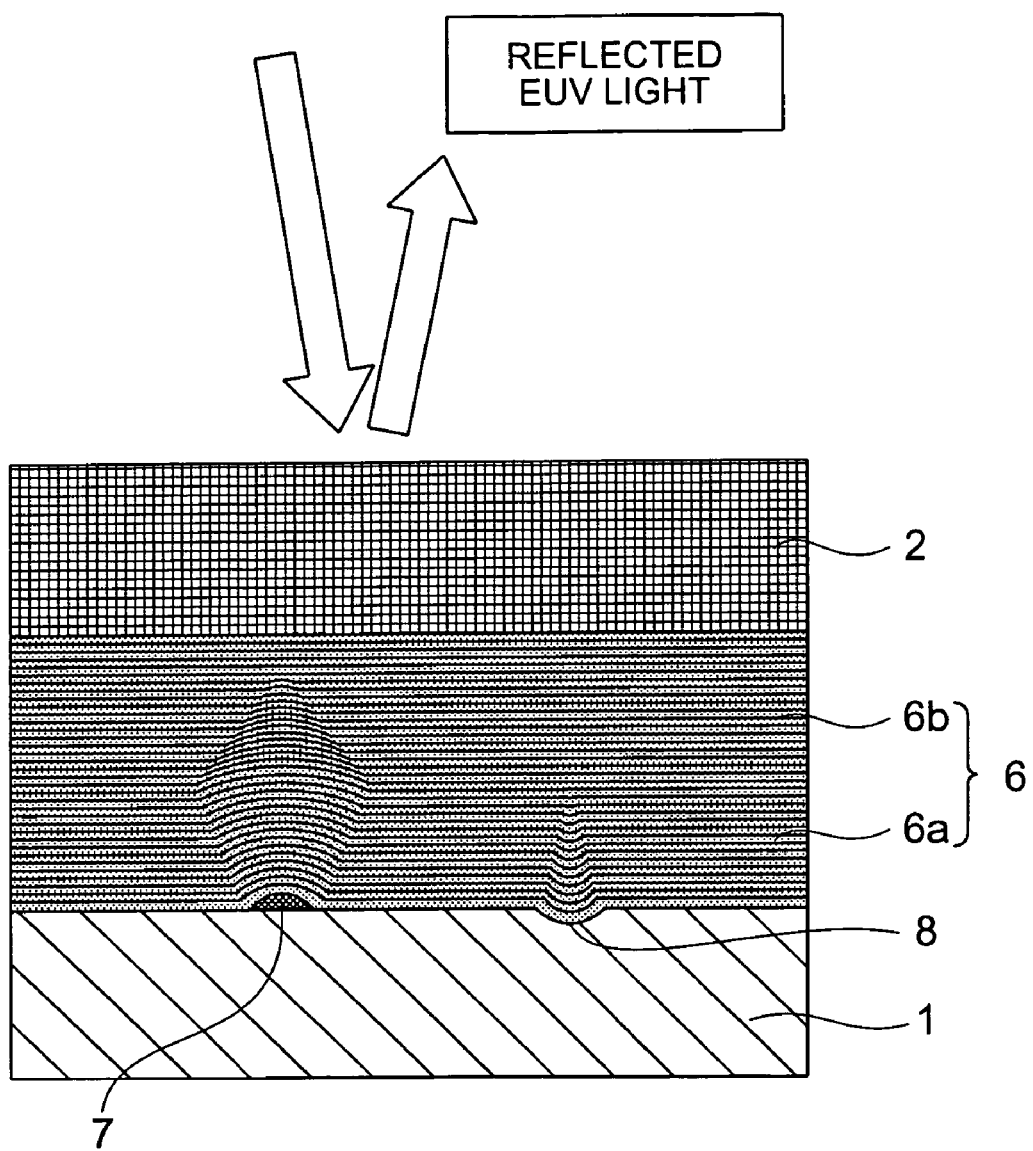
FIG. 3 is an exemplary sectional view of a multilayer reflective film coated substrate according to an embodiment of this invention.

At first, multilayer reflective film coated substrates of this invention will be described.

This invention provides two types of multilayer reflective film coated substrates.

One is a multilayer reflective film coated substrate comprising a multilayer under film comprised of Mo/Si alternately-layered films and a multilayer reflective film comprised of Mo/Si alternately-layered films for reflecting exposure light, which are formed on a substrate in this order, wherein, given that a cycle length of the multilayer under film is d bottom [unit:nm] and a cycle length of the multilayer reflective film is d top [unit:nm], the relationship of a formula (1) is satisfied when d bottom>d top, the formula (1) given by $$(n+0.15) \times d\ top \leq d\ bottom \leq (n+0.9) \times d\ top$$

where n is a natural number equal to or greater than 1.

The other is a multilayer reflective film coated substrate comprising a multilayer under film comprised of Mo/Si alternately-layered films and a multilayer reflective film comprised of Mo/Si alternately-layered films for reflecting exposure light, which are formed on a substrate in this order, wherein, given that a cycle length of the multilayer under film is d bottom [unit:nm] and a cycle length of the multilayer reflective film is d top [unit:nm], the relationship of a formula (2) is satisfied when d bottom<d top, the formula (2) given by $$d\ bottom \leq 0.6 \times d\ top.$$

The multilayer reflective film coated substrates of this invention have the structure in which the multilayer under film having an effect of smoothing unevenness of the substrate being surface defects of the substrate is first formed on the substrate by the Mo/Si alternately-layered films and then the multilayer reflective film comprised of the Mo/Si alternately-layered films for reflecting exposure light is formed on the multilayer under film.

In the multilayer reflective film coated substrate having such a structure, by satisfying the relationship of the formula (1) when the cycle length d bottom of the multilayer under film is greater than the cycle length d top of the multilayer reflective film, i.e. when d bottom>d top, or by satisfying the relationship of the formula (2) when d bottom is smaller than d top, i.e. when d bottom<d top, the reflection spectrum of EUV light having a wavelength of 13.2 to 13.8 nm shows characteristics substantially equivalent to those of a structure with no multilayer under film formed on the substrate. In other words, even if the multilayer under film is formed on the substrate, this exerts substantially no optical influence.

The multilayer reflective film formed on such a multilayer under film forms a smooth surface having a small surface roughness with less surface defects and thus improves the reflectance with respect to exposure light.

In the multilayer reflective film coated substrate of this invention, the cycle length d bottom of the multilayer under film comprised of the Mo/Si alternately-layered films and formed on the substrate is normally approximately 8.0 to 12.0 nm and preferably 10.0 to 11.0 nm, and the number of cycles is normally approximately 10 to 80 and preferably 20 to 40.

The thickness of the multilayer under film may be set to a value that can reduce convex and concave defects of the substrate surface by forming the multilayer film. However, if the thickness of the multilayer under film is too large, the flatness of the substrate is degraded due to the film stress and further, film stripping may occurs. Therefore, it is desirably a thickness that is minimally required. The thickness of the multilayer under film is preferably 2 μm or less.

On the other hand, in this invention, it is preferable that the cycle length d top falls within the range of 6.5 to 7.5 nm and ΓMo [apparent Mo layer thickness/cycle length] falls within the range of 0.25 to 0.70 in the multilayer reflective film comprised of the Mo/Si alternately-layered films. It is particularly preferable that d top is 6.9 to 7.1 nm and ΓMo be 0.35 to 0.45. Further, the number of cycles is normally approximately 40 to 70 and preferably 40 to 50.

The apparent Mo layer thickness in ΓMo is defined as follows:

(apparent Mo layer thickness)=(Mo layer thickness)+ (diffusion layer thickness)/2

The diffusion layer largely changes depending on the film forming conditions and so on, but if the apparent Mo layer thickness is defined as above, optical behavior (peak wavelength position etc.) does not depend on the thickness of the diffusion layer.

The total thickness of the multilayer reflective film is normally approximately 250 to 450 nm and preferably 250 to 360 nm.

In the multilayer reflective film coated substrate of this invention, an intermediate layer in the form of a silicon film can be interposed between the multilayer under film and the multilayer reflective film. The thickness of the intermediate layer in the form of the silicon film is normally approximately 2 to 30 nm and preferably 5 to 11 nm.

As the substrate in the multilayer reflective film coated substrate of this invention, a glass substrate can be suitably used. The glass substrate is excellent in smoothness and flatness and thus is particularly suitable as a substrate for a mask. As a material of the glass substrate, use is made of an amorphous glass (e.g. $SiO_2$—$TiO_2$-based glass) having a low thermal expansion coefficient, a quartz glass, a crystallized glass precipitated with β-quartz solid solution, or the like. The substrate preferably has a smooth surface of 0.2 nmRms or less and a flatness of 100 nm or less for achieving a high reflectance and transfer accuracy. In this invention, the unit Rms showing the smoothness represents the root mean square roughness and can be measured by an atomic force microscope. Further, the flatness in this invention is a value indicative of surface warp (deformation) given by TIR (total indicated reading). This is an absolute value of a difference between the highest position of the substrate surface located above a focal plane, given as a plane determined by the method of least squares on the basis of the substrate surface, and the lowest position located below the focal plane. The smoothness represents a smoothness in 10 μm square area and the flatness represents a flatness in 142 mm square area.

Now, a multilayer reflective film coated substrate manufacturing method of this invention will be described.

The multilayer reflective film coated substrate manufacturing method of this invention is a method of forming a multilayer under film comprised of Mo/Si alternately-layered films and a multilayer reflective film comprised of Mo/Si alternately-layered films for reflecting exposure light, on a substrate in this order and is characterized by combining a normal incidence film formation method that causes sputtered particles from a target to be incident on the substrate from a substantially perpendicular direction and an oblique incidence film formation method that causes sputtered particles from the target to be incident on the substrate from an oblique direction with respect to a perpendicular direction.

In the manufacturing method of this invention, there is no particular limitation to the order of combination between the normal incidence film formation method and the oblique incidence film formation method as long as the multilayer under film and the multilayer reflective film are formed so that the cycle length d bottom of the multilayer under film and the cycle length d top of the multilayer reflective film satisfy the foregoing specific relationship.

As one example of the combination between the normal incidence film formation method and the oblique incidence film formation method, use can be made of a method of forming the multilayer under film by combining the normal incidence film formation method and the oblique incidence film formation method.

If the multilayer under film is formed by combining the normal incidence film formation method and the oblique incidence film formation method before forming the multilayer reflective film on the substrate, convex and concave defects present on the substrate surface both can be reduced in size to thereby reduce in number surface defects, such as the convex and concave defects present on the substrate surface, on the multilayer under film. As a consequence, it is possible to allow the multilayer under film to have a smoother surface with a small surface roughness. Therefore, by forming the multilayer reflective film on the multilayer under film caused to have the surface smoother than the substrate surface by reducing the surface defects such as the convex and concave defects, the smooth multilayer reflective film with no surface defects and a small surface roughness can be formed. Therefore, a multilayer reflective film coated substrate with less defects and an improved reflectance with respect to exposure light can be obtained.

The oblique incidence film formation method has an effect of reducing in size a concave defect present on the substrate surface. On the other hand, it has been found according to the study of the present inventors that when the multilayer reflective film is formed by the normal incidence film formation method, although a convex defect present on the substrate surface is reduced in size, there is an adverse effect of increasing in size a concave defect present on the substrate surface. Further, when the multilayer reflective film is formed by the normal incidence film formation method, there is also an effect of reducing the surface roughness of the multilayer reflective film, thus improving the reflectance.

The multilayer under film is formed by combining the normal incidence film formation method and the oblique incidence film formation method. It is preferable that the manner of combination thereof be properly determined according to the number of defects, the sizes of defects, the heights of defects (convex defects), the depths of defects (concave defects), and so on to thereby reduce both convex and concave defects present on the substrate surface. FIG. 3 is an exemplary sectional view of a multilayer reflective film coated substrate according to an embodiment of this invention.

A convex defect (foreign matter defect) 7 and a concave defect 8 are present on the surface of a substrate 1. On the substrate 1, a multilayer under film 6 comprised of a multilayer under film 6a formed by the oblique incidence film formation method and a multilayer under film 6b formed by the normal incidence film formation method is formed. Further, a multilayer reflective film 2 for reflecting exposure light (EUV light) is formed on the multilayer under film 6. The convex defect 7 and the concave defect 8 present on the surface of the substrate 1 are reduced in size by forming thereon the multilayer under film 6 obtained by combining the normal incidence film formation method and the oblique incidence film formation method. In this manner, surface defects corresponding to the convex defect 7 and the concave defect 8 on the surface of the substrate 1 can be reduced on the surface of the multilayer under film 6.

The under film right under the multilayer reflective film is preferably formed by the normal incidence film formation method. By forming the under film right under the multilayer reflective film by the normal incidence film formation method, the surface roughness of the multilayer under film can be further reduced. By forming the multilayer reflective film thereon, the reflectance can be further improved with respect to the exposure light.

As shown in FIG. 1A, the oblique incidence film formation method is carried out by disposing the target 40 and the substrate 1 so that sputtered particles from the target 40 are incident on the substrate 1 from the oblique direction 41 with respect to the perpendicular direction S. More specifically, it is preferable that the oblique incidence film formation be carried out by causing sputtered particles from the target 40 to be incident on the substrate 1 from a direction inclined by 50° to 80° with respect to the perpendicular direction S and it is particularly preferable that the film formation be carried out by causing the sputtered particles to be incident on the substrate 1 from a direction inclined by 50° to 70° with respect to the perpendicular direction S. On the other hand, as shown in FIG. 1B, the normal incidence film formation method is carried out by disposing the target 40 and the substrate 1 so that sputtered particles from the target 40 are incident on the substrate 1 from the substantially perpendicular direction 42. More specifically, it is preferable that the normal incidence film formation be carried out by causing sputtered particles from the target 40 to be incident on the substrate 1 from the perpendicular direction or an approximately perpendicular direction inclined by 35° or less with respect to the perpendicular direction.

In a film formation apparatus (e.g. an ion beam sputtering apparatus) for use in formation of a multilayer under film, whether to cause particles sputtered from a target toward a substrate to be incident from a substantially perpendicular direction or from a direction inclined to a perpendicular direction can be changed, for example, by adjusting an angle of the substrate with respect to the target. Therefore, the formation of the multilayer under film can be carried out by specifying convex and concave defects on the substrate surface by the use of a defect inspection apparatus in advance and, according to the number of the defects and so on, properly switching between the normal incidence film formation method and the oblique incidence film formation method, for example, by adjusting the angle of the substrate with respect to the target.

In this invention, the same Mo/Si alternately-layered films are used for the multilayer under film and the multilayer reflective film formed thereon. Therefore, there is an advantage in that the formation of the multilayer reflective film can be carried out after the formation of the multilayer under film without changing targets. This leads to a reduction of the film formation time.

The multilayer under film can be formed, for example, using an ion beam sputtering film formation method. By forming the multilayer under film using the ion beam sputtering film formation method, the film forming direction can be easily changed and, further, the highly-smooth, highly-dense film can be formed.

Figure 4:
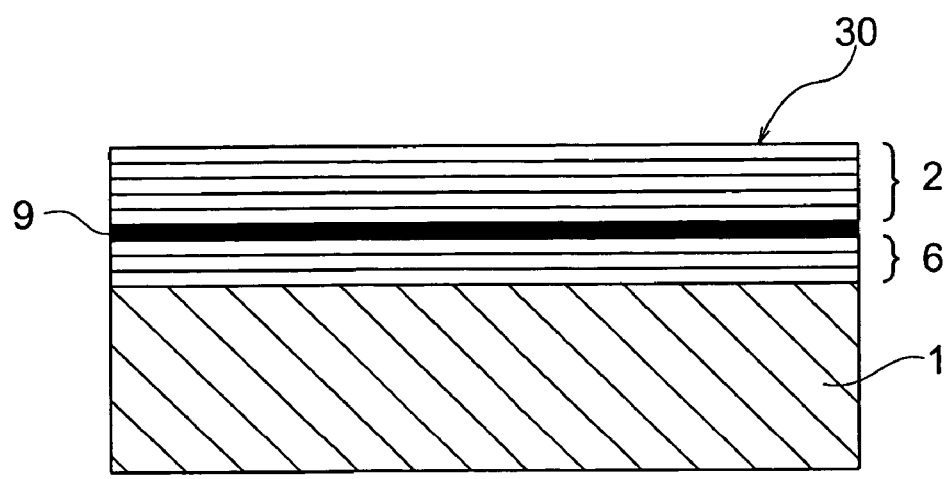
FIG. 4 is a sectional view of a multilayer reflective film coated substrate according to an embodiment of this invention.

FIG. 4 is a sectional view of a multilayer reflective film coated substrate according to an embodiment of this invention. A multilayer reflective film coated substrate 30 has a multilayer under film 6, an intermediate layer 9 provided where necessary, and a multilayer reflective film 2, which are formed on a substrate 1 in this order. The multilayer reflective film coated substrate 30 is obtained by forming on the substrate 1 the multilayer under film 6 comprised of Mo/Si alternately-layered films, for example, by combining the normal incidence film formation method and the oblique incidence film formation method, then forming the intermediate layer 9 in the form of a silicon film on the multilayer under film 6 where necessary, and further, forming the multilayer reflective film 2 comprised of Mo/Si alternately-layered films.

The multilayer reflective film 2 formed on the multilayer under film 6 or on the intermediate layer 9 provided where necessary has the structure in which Mo and Si having different refractive indices are alternately laminated and has a high reflectance with respect to light having a particular wavelength, for example, EUV light of 13 to 14 nm.

The multilayer reflective film 2 can be formed, for example, by ion beam sputtering according to the oblique incidence film formation method.

The multilayer reflective film coated substrate having the multilayer under film and the multilayer reflective film formed on the substrate as described above is used, for example, as a multilayer reflective film coated substrate in an EUV reflective mask blank or an EUV reflective mask or as a multilayer reflective film mirror in an EUV lithography system.

Now, a reflective mask blank of this invention will be described.

By forming an absorber film for absorbing the exposure light, on the multilayer reflective film in the foregoing multilayer reflective film coated substrate of this invention, the exposure reflective mask blank is obtained. According to necessity, a buffer film having resistance to etching environment during pattern formation of the absorber film for protecting the multilayer reflective film may be interposed between the multilayer reflective film and the absorber film. Since the reflective mask blank is manufactured using the multilayer reflective film coated substrate of this invention and forming the absorber film on its multilayer reflective film, it is possible to obtain the reflective mask blank particularly with the multilayer reflective film having a small surface roughness with less defects and thus increased in exposure light reflectance, which finally serves as a reflecting surface of a mask.

Figure 5:
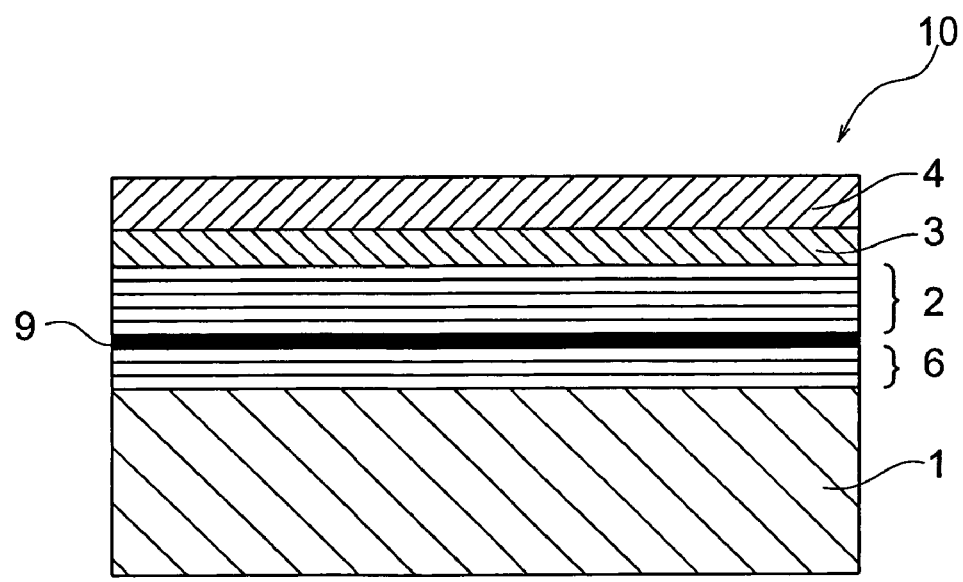
FIG. 5 is a sectional view of a reflective mask blank according to an embodiment of this invention.

FIG. 5 is a sectional view of a reflective mask blank according to an embodiment of this invention. According to FIG. 5, the reflective mask blank 10 has a buffer film 3 and an absorber film 4 in this order on the multilayer reflective film 2 of the foregoing multilayer reflective film coated substrate.

As a material of the absorber film 4, a selection is made of a material having a high exposure light absorptance and a sufficiently large etching selectivity to the film (the buffer film in this embodiment, but, in a structure having no buffer film, the multilayer reflective film) located under the absorber film. For example, a material containing Ta as a main metal component is preferable. In this case, if a material containing Cr as a main component is used as the buffer film, it is possible to achieve a large etching selectivity (10 or more). The material containing Ta as the main metal element is normally a metal or an alloy. In terms of smoothness and flatness, the material preferably has an amorphous or crystallite structure. As the material containing Ta as the main metal element, use can be made of a material containing Ta and B, a material containing Ta and N, a material containing Ta, B, and O, a material containing Ta, B, and N, a material containing Ta and Si, a material containing Ta, Si, and N, a material containing Ta and Ge, a material containing Ta, Ge, and N, or the like. By adding B, Si, Ge, or the like to Ta, the amorphous material can be easily obtained to improve the smoothness. On the other hand, by adding N or O to Ta, the resistance to oxidation is improved. Therefore, it is possible to improve the aging stability.

As other absorber film materials, use can be made of a material containing Cr as a main component (chromium, chromium nitride, or the like), a material containing tungsten as a main component (tungsten nitride or the like), a material containing titanium as a main component (titanium, titanium nitride, or the like), and so on.

Those absorber films can be formed by normal sputtering. The thickness of the absorber film is set to a value that can sufficiently absorb the exposure light, for example, the EUV light and is normally set to approximately 30 to 100 nm.

The buffer film 3 serves as an etching stop layer to protect the underlying multilayer reflective film while the absorber film 4 is formed into a transfer pattern. In this embodiment, the buffer film 3 is formed between the multilayer reflective film and the absorber film. The buffer film may be provided according to necessity.

As a material of the buffer film, a selection is made of a material having a large etching selectivity to the absorber film. The etching selectivity between the buffer film and the absorber film is 5 or more, preferably 10 or more, and more preferably 20 or more. Further, the material is preferably low in stress and excellent in smoothness and, particularly, has a smoothness of 0.3 nmRms or less. From this point of view, the material forming the buffer film preferably has a crystallite or amorphous structure.

Generally, Ta, an Ta alloy, or the like is often used as a material of the absorber film. When the Ta-based material is used as the material of the absorber film, it is preferable to use a material containing Cr as the buffer film. For example, use is made of Cr alone or a material containing Cr and at least one element selected from nitrogen, oxygen, and carbon. Specifically, it is chromium nitride (CrN) or the like.

On the other hand, when Cr alone or a material containing Cr as a main component is used as the absorber film, use can be made, as the buffer film, of a material containing Ta as a main component, for example, a material containing Ta and B, a material containing Ta, B, and N, or the like.

When forming a reflective mask, the buffer film may be removed in a pattern according to the pattern of the absorber film in order to prevent a reduction in reflectance of the mask. On the other hand, if it is possible to use a material with a large exposure light transmittance as the buffer film and to sufficiently reduce the thickness thereof, the buffer film may be left so as to cover the multilayer reflective film without removing it in the pattern. The buffer film can be formed by a film formation method such as normal sputtering (DC sputtering or RF sputtering) or ion beam sputtering. When performing correction of the absorber film pattern by the use of a focused ion beam (FIB), the thickness of the buffer film is preferably set to approximately 20 to 60 nm, but, when the FIB is not used, may be set to approximately 5 to 15 nm.

Now, a reflective mask of this invention will be described.

By forming the absorber film of the foregoing reflective mask blank into the predetermined transfer pattern, the reflective mask of this invention is obtained.

The pattern formation of the absorber film can be carried out by the use of the lithography technique.

Figure 6A:
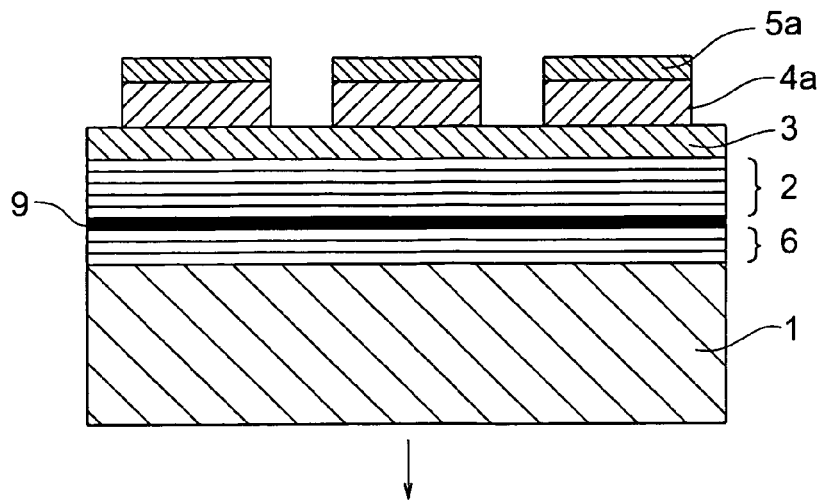
FIGS. 6A to 6C are explanatory sectional views showing manufacturing processes of a reflective mask according to an embodiment of this invention.
Figure 6B:
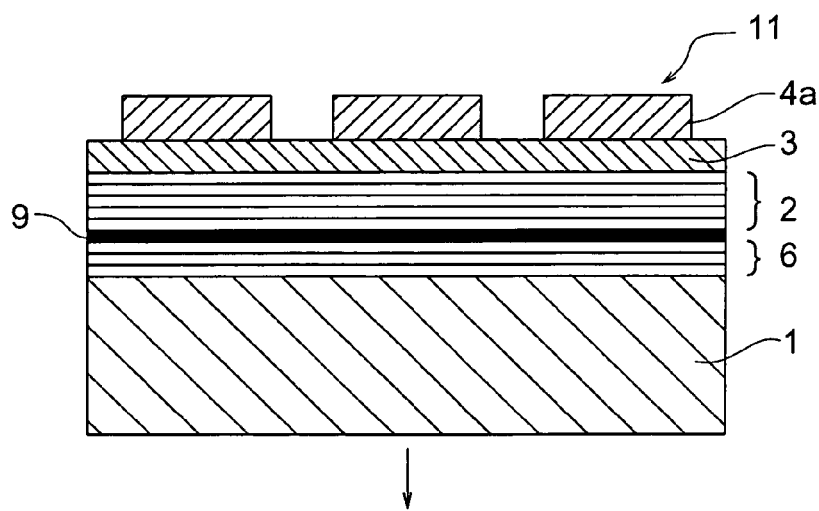
Figure 6C:
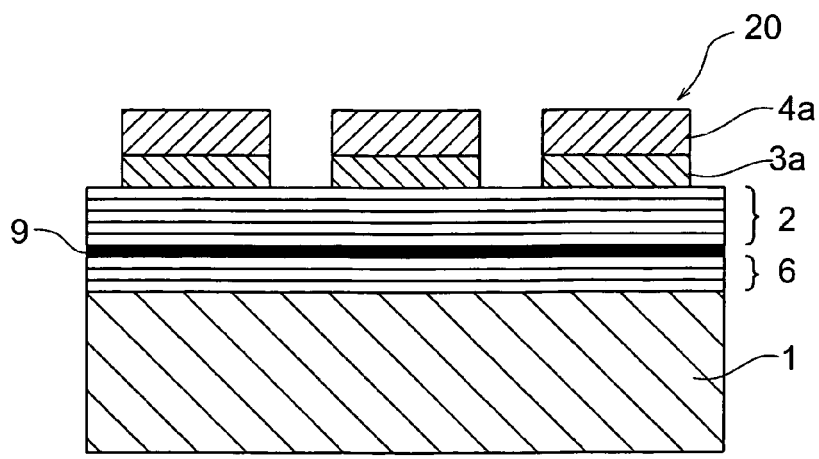

FIGS. 6A to 6C are explanatory sectional views showing manufacturing processes of a reflective mask according to an embodiment of this invention. The manufacture of the reflective mask will be described with reference to FIGS. 6A to 6C. At first, the foregoing reflective mask blank 10 (see FIG. 5) is prepared.

Then, a resist layer is formed on the absorber film 4 of the reflective mask blank 10 and is then subjected to pattern writing and development to thereby form a predetermined resist pattern 5a (see FIG. 6A). Then, using this resist pattern 5a as a mask, the absorber film 4 is formed into a pattern 4a according to a technique such as etching. For example, in the case of the absorber film containing Ta as a main component, it is possible to apply dry etching using a chlorine gas or a gas containing trifluoromethane.

By removing the remaining resist pattern 5a, a mask 11 formed with the predetermined absorber film pattern 4a is obtained as shown in FIG. 6B.

After forming the absorber film 4 into the pattern 4a, the buffer film 3 is removed according to the absorber film pattern 4a. Thus, there is obtained a reflective mask 20 (see FIG. 6C) in which the multilayer reflective film 2 is exposed in an area where the absorber film pattern 4a is not present. Herein, in the case of the buffer film, for example, made of the Cr-based material, it is possible to apply dry etching using a mixed gas containing chlorine and oxygen. When the required reflectance is ensured without removing the buffer film 3, the buffer film 3 may be left on the multilayer reflective film 2 without processing the buffer film 3 into the pattern following the absorber film pattern 4a as shown in FIG. 6B.

According to this invention, since the reflective mask is fabricated by the use of the foregoing reflective mask blank, it is possible to obtain the reflective mask that has no pattern defects particularly caused by surface defects on the reflecting surface of the mask and thus is excellent in pattern transferability.

EXAMPLES

Now, this invention will be described in further detail in terms of Examples, but this invention is by no means limited by those Examples.

Example 1

As a substrate, there was prepared a low thermal expansion $SiO_2$—$TiO_2$-based glass substrate having a 152 mm square shape with a thickness of 6.35 mm. This glass substrate had a smooth surface of 0.15 nmRms and a flatness of 100 nm or less by mechanical polishing and cleaning.

Surface defects (convex and concave defects) on the surface of the obtained glass substrate were measured by the use of a defect inspection apparatus (MAGICS M-1350 manufactured by Lasertec Corporation) and it was found that several hundreds of convex and concave defects were present over the entire substrate.

Then, a multilayer under film comprised of Mo/Si alternately-layered films was formed on the substrate. The film formation was carried out by the use of an ion beam sputtering apparatus. At first, the angle of the substrate in the apparatus was adjusted so that sputtered particles from a target were incident on the substrate from a direction inclined by 60° with respect to the perpendicular direction. Then, at first, a Si film was formed to a thickness of 6.0 nm by the use of a Si target, then a Mo film was formed to a thickness of 4.0 nm by the use of a Mo target and, given that this formed one cycle, Si and Mo films were layered by 10 cycles. Thereafter, the angle of the substrate in the apparatus was adjusted so that sputtered particles from the target were incident on the substrate from the perpendicular direction. Then, a Si film was formed to a thickness of 4.0 nm by the use of the Si target, then a Mo film was formed to a thickness of 6.0 nm by the use of the Mo target and, given that this formed one cycle, Si and Mo films were layered by 10 cycles.

The multilayer under film thus formed was such that the cycle length was 10 nm, ΓMo was 0.431, the number of cycles was 20, and the thickness was 200 nm.

Then, on this multilayer under film, a Si film as an intermediate layer was formed to a thickness of 10.0 nm according to the normal incidence film formation method by the use of the ion beam sputtering apparatus.

Then, on this intermediate-layer Si film, alternately-layered films made of Mo and Si suitable as a reflective film for a region of 13 to 14 nm exposure wavelength were formed as a multilayer reflective film. The film formation was carried out by the use of the ion beam sputtering apparatus. Herein, the angle of the substrate in the apparatus was adjusted so that sputtered particles from the target were incident on the substrate from a direction inclined by 60° with respect to the perpendicular direction. At first, a Si film was formed to a thickness of 4.2 nm by the use of the Si target, then a Mo film was formed to a thickness of 2.8 nm by the use of the Mo target and, given that this formed one cycle, Si and Mo films were layered by 40 cycles and, finally, a Si film (capping layer) was formed to a thickness of 11.0 nm. In this manner, a multilayer reflective film coated substrate was produced.

The multilayer reflective film thus formed was such that the cycle length was 7.0 nm, ΓMo was 0.431, the number of cycles was 40, and the thickness was 280 nm.

Therefore, d bottom (10.0 nm)>d top (7.0 nm) and thus the relationship of the formula (1) can be satisfied when n=1.

The reflectance of the multilayer reflective film of the multilayer reflective film coated substrate thus obtained was measured by applying EUV light of 13.5 nm at an incident angle of 6.0° and it was 65.4%, i.e. high reflectance.

Further, surface defects (convex and concave defects) of the multilayer reflective film were measured by the foregoing defect inspection apparatus and several tens of surface defects were found.

Example 2

A multilayer reflective film coated substrate was produced in the same manner as in Example 1 except that a Si film and a RuNb film were formed to thicknesses of 4.0 nm and 2.5 nm, respectively, as a capping layer on the multilayer reflective film.

The reflectance of the multilayer reflective film of this multilayer reflective film coated substrate was measured in the same manner as in Example 1 and it was 64.4%.

Further, surface defects (convex and concave defects) of the multilayer reflective film were measured by the foregoing defect inspection apparatus and several tens of surface defects were found.

Example 3

A multilayer under film comprised of Mo/Si alternately-layered films was formed on the same substrate as that in Example 1. The film formation was carried out by the use of the ion beam sputtering apparatus. At first, the angle of the substrate in the apparatus was adjusted so that sputtered particles from the target were incident on the substrate from a direction inclined by 60° with respect to the perpendicular direction. Then, at first, a Si film was formed to a thickness of 2.5 nm by the use of the Si target, then a Mo film was formed to a thickness of 1.5 nm by the use of the Mo target and, given that this formed one cycle, Si and Mo films were layered by 10 cycles. Thereafter, the angle of the substrate in the apparatus was adjusted so that sputtered particles from the target were incident on the substrate from the perpendicular direction. Then, a Si film was formed to a thickness of 1.5 nm by the use of the Si target, then a Mo film was formed to a thickness of 2.5 nm by the use of the Mo target and, given that this formed one cycle, Si and Mo films were layered by 10 cycles.

The multilayer under film thus formed was such that the cycle length was 4.0 nm, ΓMo was 0.431, the number of cycles was 20, and the thickness was 80 nm.

Subsequent processes were the same as those in Example 1, thereby fabricating a multilayer reflective film coated substrate.

Therefore, d bottom (4.0 nm)<d top (7.0 nm) and thus the relationship of the formula (2) can be satisfied.

The reflectance of the multilayer reflective film of this multilayer reflective film coated substrate was measured in the same manner as in Example 1 and it was 65.5%.

Further, surface defects (convex and concave defects) of the multilayer reflective film were measured by the foregoing defect inspection apparatus and several tens of surface defects were found.

Comparative Example 1

A multilayer reflective film coated substrate was produced in the same manner as in Example 1 except that the multilayer under film and the intermediate layer were not formed.

The reflectance of the multilayer reflective film of this multilayer reflective film coated substrate was measured in the same manner as in Example 1 and it was 64.3%.

Further, surface defects (convex and concave defects) of the multilayer reflective film were measured by the foregoing defect inspection apparatus and several hundreds of surface defects were found.

Comparative Example 2

A multilayer reflective film coated substrate was produced in the same manner as in Example 2 except that the multilayer under film and the intermediate layer were not formed.

The reflectance of the multilayer reflective film of this multilayer reflective film coated substrate was measured in the same manner as in Example 1 and it was 65.4%.

Further, surface defects (convex and concave defects) of the multilayer reflective film were measured by the foregoing defect inspection apparatus and several hundreds of surface defects were found.

Example 4

A buffer film made of chromium nitride (CrN:N=10 at %) was formed on the capping layer of the multilayer reflective film of the multilayer reflective film coated substrate obtained in Example 1. The film formation was carried out by the use of a DC magnetron sputtering apparatus and the thickness was set to 20 nm.

Then, a film containing Ta as a main component and further containing B and N was formed on the buffer film as an absorber film with respect to exposure light having a wavelength of 13 to 14 nm. The film formation was carried out in a DC magnetron sputtering apparatus using a target containing Ta and B and adding nitrogen in an amount of 10 vol % to argon. The thickness was set to 70 nm as a thickness that can sufficiently absorb the exposure light. The composition ratio of the formed TaBN film was such that Ta was 0.8, B was 0.1, and N was 0.1.

In the manner as described above, a reflective mask blank was produced.

Then, the absorber film of this reflective mask blank was formed into a pattern. In this manner, a reflective mask was produced.

At first, an EB resist was coated on the reflective mask blank and a predetermined resist pattern was formed by EB writing and development. Then, using this resist pattern as a mask, dry etching was applied to the TaBN film being the absorber film by the use of chlorine. In this manner, an absorber film pattern was formed.

Then, using the absorber film pattern as a mask, dry etching was applied to the CrN film being the buffer film by the use of a mixed gas of chlorine and oxygen (mixing ratio was 1:1 by volume ratio) to remove the buffer film in a pattern according to the absorber film pattern. In this manner, a reflective mask was produced.

Figure 7:
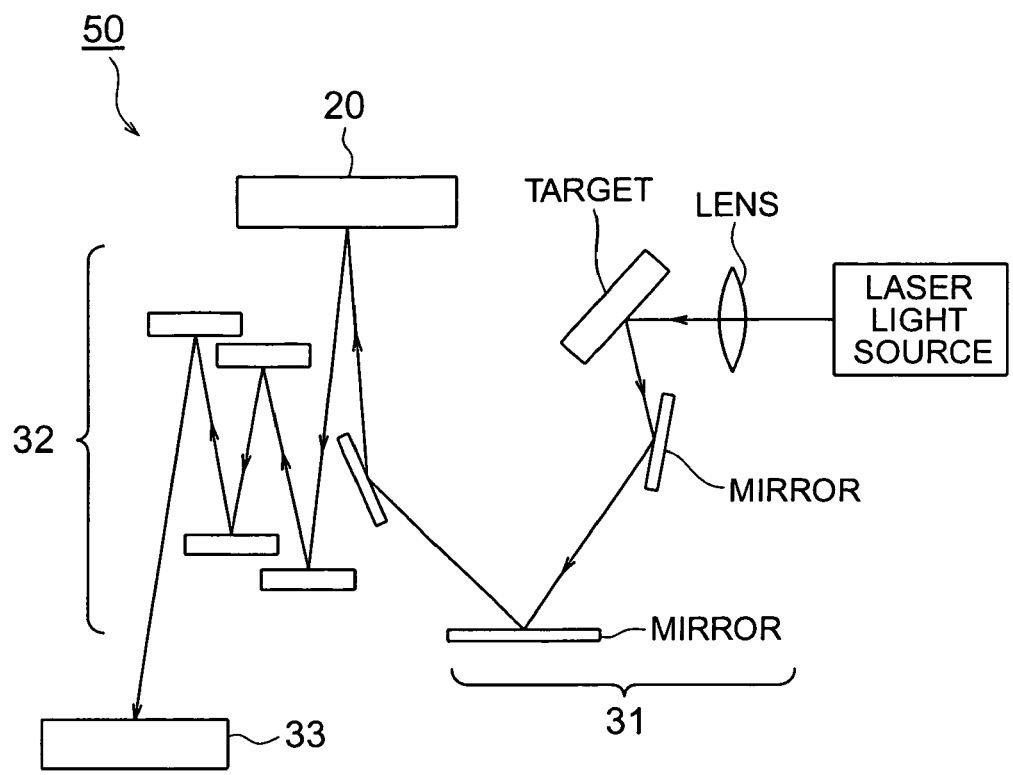
FIG. 7 is a schematic structural diagram of a pattern transfer apparatus used in Examples and Comparative Examples.

Pattern defects of this reflective mask were measured by the use of a mask pattern inspection apparatus (KLA-500 Series manufactured by KLA-Tencor Corporation) and it was found that there were no pattern defects. Further, using this reflective mask, pattern transfer onto a semiconductor substrate was carried out by the use of a pattern transfer apparatus 50 as shown in FIG. 7. The pattern transfer apparatus 50 is roughly comprised of a laser plasma X-ray source 31, a reduction optical system 32, and so on, wherein a pattern reflected from a reflective mask 20 is normally reduced in size to about a quarter through the reduction optical system 32. Since the wavelength band of 13 to 14 nm was used as an exposure wavelength, it was set in advance that an optical path was located in a vacuum. In this state, the EUV light obtained from the laser plasma X-ray source 31 was incident on the reflective mask 20 and light reflected therefrom was transferred onto a semiconductor substrate (resist-coated silicon wafer) 33 through the reduction optical system 32. As a result, an excellent transfer image was obtained on the semiconductor substrate.

Comparative Example 3

A reflective mask blank and then a reflective mask were fabricated in the same manner as in Example 4 except that the multilayer reflective film coated substrate obtained in Comparative Example 1 was used instead of the multilayer reflective film coated substrate obtained in Example 1.

Using this reflective mask, pattern defects were measured in the same manner as in Example 4. Then, several tens of pattern defects were detected.

Further, using this reflective mask, pattern transfer onto a semiconductor substrate was carried out in the same manner as in Example 4. Then, many pattern defects were detected and thus it was practically unusable.

The multilayer reflective film coated substrate of this invention has high surface smoothness with less defects and thus is suitable for a reflective mask for use in the lithography method using exposure light in a short wavelength region such as EUV light.

What is claimed is:

1. A multilayer reflective film coated substrate, comprising:
    a multilayer under film, which consists of a first plurality of first Mo/Si alternately-layered films and is formed on a substrate, the first plurality of first Mo/Si alternately-layered films being formed by alternately laminating a first combination of an Si layer and a Mo layer as one cycle so that a cycle length of the multilayer under film is given as d bottom (unit:nm), and
    a multilayer reflective film, which consists of a second plurality of second Mo/Si alternately-layered films for reflecting exposure light and is formed on the multilayer under film, the second plurality of second Mo/Si alternately-layered films being formed by alternately laminating a second combination of an Si layer and a Mo layer as one cycle so that a cycle length of the multilayer reflective film is given as d top (unit:nm), the cycle length of each said second plurality of second Mo/Si alternately-layered films being substantially the same, wherein d bottom>d top, and
    a relationship of a formula (1) is satisfied when d bottom>d top, the formula (1) being given by $(n+0.15) \times d \text{ top} \leq d \text{ bottom} \leq (n+0.9) \times d \text{ top}$ where n is a natural number equal to or greater than 1.

2. A multilayer reflective film coated substrate according to claim 1, wherein:
    the d top is 6.5 to 7.5 nm and ΓMo (where Γ is the apparent layer thickness/cycle length) is 0.25 to 0.70 in the multilayer reflective film.

3. A multilayer reflective film coated substrate according to claim 1, wherein:
    an intermediate layer in the form of a silicon film is interposed between the multilayer under film and the multilayer reflective film.

4. A method of manufacturing the multilayer reflective film coated substrate according to claim 1, the method comprising the step of forming the multilayer under film comprised of the first Mo/Si alternately-layered films and the multilayer reflective film comprised of the second Mo/Si alternately-layered films for reflecting the exposure light, on the substrate in this order,
    wherein the method combines a normal incidence film formation method that causes sputtered particles from a target to be incident on the substrate from a substantially perpendicular direction and an oblique incidence film formation method that causes sputtered particles from the target to be incident on the substrate from an oblique direction with respect to a perpendicular direction.

5. A method according to claim 4, wherein:
    the multilayer under film and the multilayer reflective film are formed by an ion beam sputtering method.

6. A reflective mask blank obtained by forming an absorber film for absorbing the exposure light, on the multilayer reflective film in the multilayer reflective film coated substrate according to claim 1.

7. A reflective mask obtained by forming the absorber film in the reflective mask blank according to claim 6 with an absorber film pattern that serves as a transfer pattern.

8. A multilayer reflective film coated substrate according to claim 1, wherein:
    the d top is 6.5 to 7.5 nm and ΓMo (where Γ is the apparent layer thickness/cycle length) is 0.25 to 0.70 in the multilayer reflective film.

9. A multilayer reflective film coated substrate, comprising:
    a multilayer under film, which consists of a first plurality of first Mo/Si alternately-layered films and is formed on a substrate, the first plurality of first Mo/Si alternately-layered films being formed by alternately laminating a first combination of an Si layer and a Mo layer as one cycle so that a cycle length of the multilayer under film is given as d bottom (unit:nm), and
    a multilayer reflective film, which consists of a second plurality of second Mo/Si alternately-layered films for reflecting exposure light and is formed on the multilayer under film, the second plurality of second Mo/Si alternately-layered films being formed by alternately laminating a second combination of an Si layer and a Mo layer as one cycle so that a cycle length of the multilayer reflective film is given as d top (unit:nm), the cycle length of each said second plurality of second Mo/Si alternately-layered films being substantially the same, wherein d bottom<d top, and
    a relationship of a formula (2) is satisfied when d bottom<d top, the formula (2) being given by $d \text{ bottom} < 0.6 \times d \text{ top}.$ 10. A multilayer reflective film coated substrate according to claim 9, wherein:
    an intermediate layer in the form of a silicon film is interposed between the multilayer under film and the multilayer reflective film.

11. A method of manufacturing the multilayer reflective film coated substrate according to claim 9,
    the method comprising the step of forming the multilayer under film comprised of the first Mo/Si alternately-layered films and the multilayer reflective film comprised of the second Mo/Si alternately-layered films for reflecting the exposure light, on the substrate in this order,
    wherein the method combines a normal incidence film formation method that causes sputtered particles from a target to be incident on the substrate from a substantially perpendicular direction and an oblique incidence film formation method that causes sputtered particles from the target to be incident on the substrate from an oblique direction with respect to a perpendicular direction.

12. A method according to claim 11, wherein:
the multilayer under film and the multilayer reflective film are formed by an ion beam sputtering method.

13. A reflective mask blank obtained by forming an absorber film for absorbing the exposure light, on the multilayer reflective film in the multilayer reflective film coated substrate according to claim 9.

14. A reflective mask obtained by forming the absorber film in the reflective mask blank according to claim 13 with an absorber film pattern that serves as a transfer pattern.

* * * * *